United States Patent
Kataoka et al.

(10) Patent No.: US 7,495,177 B2
(45) Date of Patent: Feb. 24, 2009

(54) PRINTED WIRING BOARD, ITS MANUFACTURING METHOD, AND CIRCUIT DEVICE

(75) Inventors: Tatsuo Kataoka, Ageo (JP); Yoshikazu Akashi, Ageo (JP); Yutaka Iguchi, Shinagawa-ku (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 95 days.

(21) Appl. No.: 10/581,880

(22) PCT Filed: Dec. 2, 2004

(86) PCT No.: PCT/JP2004/017945
§ 371 (c)(1),
(2), (4) Date: Jun. 5, 2006

(87) PCT Pub. No.: WO2005/055682
PCT Pub. Date: Jun. 16, 2005

(65) Prior Publication Data
US 2007/0111401 A1 May 17, 2007

(30) Foreign Application Priority Data
Dec. 5, 2003 (JP) .............................. 2003-407540
Jul. 29, 2004 (JP) .............................. 2004-222184

(51) Int. Cl.
*H05K 1/03* (2006.01)
(52) U.S. Cl. .................... 174/255; 174/254; 174/256; 174/257; 174/258; 361/792; 361/793; 361/794; 361/795
(58) Field of Classification Search ......... 174/254–258; 361/792–795
See application file for complete search history.

(56) References Cited

U.S. PATENT DOCUMENTS
5,044,073 A * 9/1991 Ogasawara et al. ........... 216/13
(Continued)

FOREIGN PATENT DOCUMENTS
| JP | 2-144987 A | 6/1990 |
| JP | 4-186893 A | 7/1992 |
| JP | 6-120630 A | 4/1994 |
| JP | 8-186351 A | 7/1996 |

(Continued)

*Primary Examiner*—Dean A. Reichard
*Assistant Examiner*—Xiaoliang Chen
(74) *Attorney, Agent, or Firm*—The Webb Law Firm (57) ABSTRACT

A printed wiring board manufacturing process comprises forming a conductive metal layer on at least one surface of an insulating film with a sputtered metal layer in between, selectively etching the conductive metal layer and the sputtered metal layer to produce a wiring pattern, treating the laminated film with a first treatment liquid capable of dissolving nickel of the sputtered metal layer, and treating with a second treatment liquid capable of dissolving chrome of the sputtered metal layer and also capable of eliminating the sputtered metal layer in the insulating film to remove a superficial surface of the insulating film exposed from the wiring pattern together with the residual sputtered metals in the superficial surface. A printed wiring board comprises an insulating film and a wiring pattern, wherein the insulating film in an area exposed from the wiring pattern has a thickness smaller by 1 to 100 nm than that of an area under the wiring pattern. The process eliminates the sputtered metals combined with the insulating film together with the superficial surface of the insulating film, and therefore the insulating film surface between wires does not contain any residual metals and a short circuit between wires is prevented.

1 Claim, 4 Drawing Sheets

U.S. PATENT DOCUMENTS

| | | | |
|---|---|---|---|
| 5,130,192 A * | 7/1992 | Takabayashi et al. | 428/332 |
| 5,334,314 A * | 8/1994 | Neel et al. | 210/640 |
| 5,998,739 A | 12/1999 | Shirai | |
| 6,071,597 A * | 6/2000 | Yang et al. | 428/209 |
| 6,620,306 B2 * | 9/2003 | Yoshimura et al. | 205/640 |
| 6,877,428 B2 * | 4/2005 | Tabuchi et al. | 101/467 |
| 2002/0148733 A1 * | 10/2002 | Saito et al. | 205/126 |
| 2005/0003673 A1 * | 1/2005 | Mahdavi | 438/710 |
| 2005/0258522 A1 * | 11/2005 | En et al. | 257/670 |

FOREIGN PATENT DOCUMENTS

| | | |
|---|---|---|
| JP | 2002-171029 A | 6/2002 |
| JP | 2003-031924 A | 1/2003 |
| JP | 2003-037137 A | 2/2003 |
| JP | 2003-188495 A | 7/2003 |
| JP | 2004-259774 A | 9/2004 |

* cited by examiner

Prior Art

PRINTED WIRING BOARD, ITS MANUFACTURING METHOD, AND CIRCUIT DEVICE

FIELD OF THE INVENTION

The present invention relates to a printed wiring board in which a wiring pattern is formed directly on a polyimide film without any intermediate adhesive layer, a process for manufacturing the printed wiring board, and a circuit device obtained by mounting an electronic component on the printed wiring board. More particularly, the invention relates to a printed wiring board that has a two-layer substrate including a base of a polyimide film and a metal layer on a surface of the insulating base, and the invention relates to a manufacturing process of the printed wiring board and a circuit device obtained by mounting an electronic component on the printed wiring board.

BACKGROUND OF THE INVENTION

Printed wiring board fabrication generally employs a copper-clad laminate produced by laminating a copper foil on a surface of an insulating film such as a polyimide film by means of an adhesive.

To produce the copper-clad laminate, the copper foil is bonded to the insulating film coated with an adhesive layer by the application of heat and pressure. Accordingly, production of the copper-clad laminate inevitably involves the handling of single copper foil. The copper foil, however, becomes limper with reduction of thickness. For the copper foil to be handled singly, the lower limit of thickness is approximately 9 to 12 μm. The copper foil having any smaller thickness is extremely difficult to handle such that it must be fixed on a support. When a copper-clad laminate includes such an extremely thin copper foil that is bonded to an insulating film with an adhesive, fabrication of a wiring pattern produces a printed wiring board that is liable to suffer warpage due to thermal shrinkage of the adhesive that bonds the copper foil. In particular, there has been a need for printed wiring boards reduced in thickness and weight to meet the size and weight reduction of electronic equipment. It has been increasingly difficult to meet such printed wiring board needs with the above three-layer copper-clad laminate consisting of an insulating film, an adhesive and a copper foil.

Accordingly, the three-layer copper-clad laminate has been replaced with a two-layer laminate in which a metal layer is directly overlaid on an insulating film. This two-layer laminate is produced by depositing a seed-layer metal on a surface of the insulating film such as a polyimide film, by electroless plating, deposition or sputtering. The metal deposit is subsequently plated with copper and is coated with a photoresist, followed by photoexposure and development. And etching is performed to form a desired wiring pattern. In particular, because the metal (Cu) layer is thin, the two-layer laminate is suitable for production of very minute wiring patterns at wire pitches of less than 30 μm.

Patent Document JP-A-2003-188495 discloses a printed wiring board fabrication process comprising etching a metal-coated polyimide film to create a pattern, in which the metal-coated polyimide film includes a first metal layer provided on the polyimide resin film by a dry metal layer production process and a second conductive metal layer plated on the first metal layer, wherein the etching is followed by a rinsing treatment of the etched surface with an oxidant. Patent Document 1 discloses Example 5 in which a nickel-chrome alloy was deposited in a thickness of 10 nm by plasma deposition, and subsequently copper was deposited in a thickness of 8 μm by plating.

Figure 7:
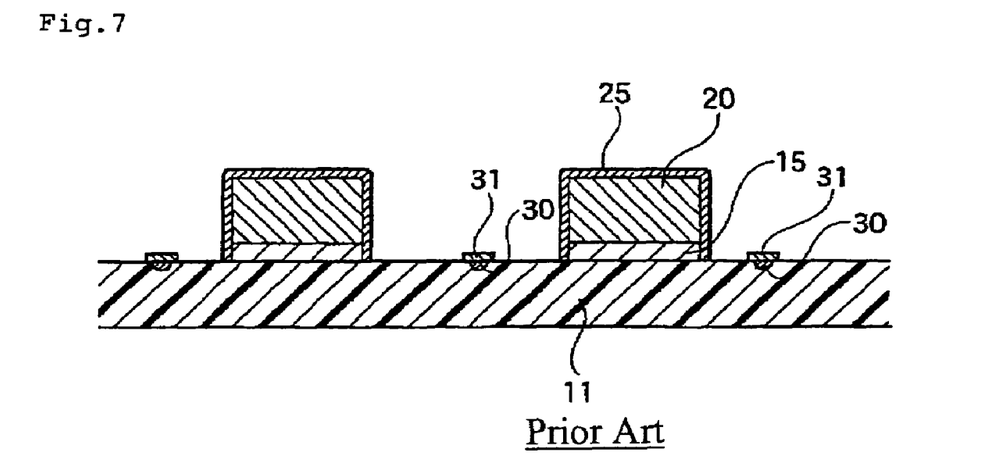
FIG. 7 is a sectional view of a printed wiring pattern fabricated by a conventional process.

Although the two-layer metal-coated polyimide film fabricated as described above enables production of minute wiring patterns, it has the following problem. That is, when a metal layer is deposited on a surface of the polyimide film substrate by plasma deposition, partial chemical bonding often occurs in the surface of the polyimide film between the metal deposited and a component of the polyimide. Such metal is difficult to remove by etching. Consequently, the polyimide film on which wiring patterns are formed often contains a trace amount of the metal combined with the polyimide film. The metal remaining in the polyimide film surface can lower insulating properties between wires. Meanwhile, it is conventional practice to plate the wiring pattern before mounting an electronic component as illustrated in FIG. 7. The metal of a first metal layer 15 often bonds a component of a polyimide film 11, and the metal may remain in the surface of the polyimide film 11 surface. The bonding of the residual metal 30 is sometimes a physical bond on the polyimide film 11 and is sometimes a chemical bond between the metal and a polyimide film component. In the case of the chemical bonding, it is difficult to completely remove the residual metal 30 by etching.

After the wiring patterns of the first metal layer 15 and second metal layer 20 have been formed on the polyimide film 11, they are often coated with a plating layer 25 for protection, generally by electroless plating. The residual metal 30 in the polyimide film causes the plating metal to deposit therefrom in the electroless plating. For example, as indicated with the numeral 31 in FIG. 7, a metal 31 deposited on the residual metal 30 can deteriorate the inherent electrical insulating properties of the polyimide film. The metal 31 deposited on the surface of the polyimide film 11 has been found to cause deteriorated electrical insulating properties between wires because of migration between the wires via the metal deposit 31. Particularly, because of this migration, the wiring pattern immediately after manufactured exhibits good insulation resistance between wires but drastically lowers the insulation resistance after continuous voltage application in excess of 1000 hours.

DISCLOSURE OF THE INVENTION

It is an object of the invention to solve the lowered insulation resistance after voltage application that has been a specific problem with the conventional printed wiring boards including the two-layer metal-coated polyimide film.

It is therefore an object of the invention to provide a process for manufacturing a printed wiring board which has less variable insulation resistance with use of a two-layer metal-coated polyimide film.

It is another object to provide a printed wiring board having less variable insulation resistance that is manufactured by the process.

It is a further object to provide a circuit device obtained by mounting an electronic component on the printed wiring board.

SUMMARY OF THE INVENTION

A process for manufacturing a printed wiring board according to the present invention comprises selectively etching a copper layer to produce a wiring pattern, the copper layer being overlaid on a polyimide film with an Ni—Cr sputtered metal layer in between, treating with a first treatment liquid capable of dissolving nickel of the Ni—Cr sputtered metal layer, and treating with a second treatment liquid capable of dissolving chrome and polyimide to remove a superficial surface of the polyimide film exposed from the wiring pattern together with the residual sputtered metals. That is, the process for manufacturing a printed wiring board comprises preparing a laminated film comprising an insulating film and a conductive metal layer provided on at least one surface of the insulating film with a sputtered metal layer in between, selectively etching the conductive metal layer and the sputtered metal layer of the laminated film to produce a wiring pattern, treating the laminated film with a first treatment liquid capable of dissolving nickel of the sputtered metal layer, and treating with a second treatment liquid capable of dissolving chrome of the sputtered metal layer and also capable of eliminating the sputtered metal layer in the insulating film to remove a superficial surface of the insulating film exposed from the wiring pattern together with the residual sputtered metals in the superficial surface.

A printed wiring board according to the present invention comprises a polyimide film and a wiring pattern formed on at least one surface of the polyimide film, wherein the polyimide film in an area under the wiring pattern is thicker by 1 to 100 nm than in an area without the wiring pattern. That is, the printed wiring board comprises an insulating film and a wiring pattern formed on at least one surface of the insulating film, wherein the insulating film in an area exposed from the wiring pattern has a thickness that is smaller by 1 to 100 nm than that of an area under the wiring pattern.

A circuit device according to the present invention comprises an electronic component mounted on a wiring pattern of the printed wiring board.

The printed wiring board manufacturing process according to the invention eliminates the residual metals combined with the superficial polyimide of the insulating polyimide film exposed from the wiring pattern, together with the superficial surface of the insulating polyimide film. Consequently, the surface of the insulating polyimide film exposed from the wiring pattern is cut to a depth of 1 to 100 nm from the surface level, and the metals present in the insulating film surface are removed together. Accordingly, the insulating film between wires can attain its inherent electrical insulating properties.

The elimination of a surface of the insulating polyimide film exposed from the wiring pattern achieves substantially perfect removal of the metals combined with the insulating film surface.

Therefore, the printed wiring board manufacturing process of the invention effectively prevents the change in resistance between wires by voltage application.

Moreover, the circuit device according to the invention possesses long-term stability because the electrical resistance between wires of the printed wiring board is stable over time.

DETAILED DESCRIPTION OF THE INVENTION

Hereinbelow, the printed wiring board according to the present invention will be described in detail along the manufacturing process.

Figure 1A:
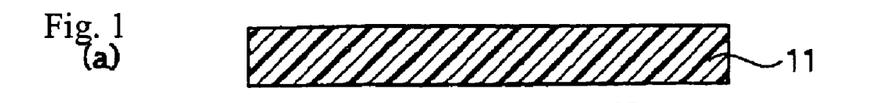
FIGS. 1(a)-1(h) are a set of sectional views of a board depicting various steps of manufacturing a printed wiring board according to the present invention.
Figure 1B:
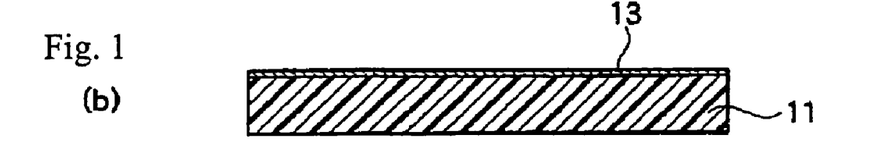
Figure 1C:
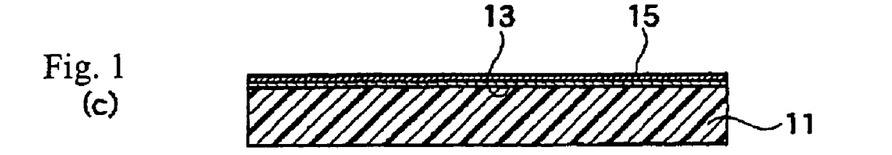
Figure 1D:
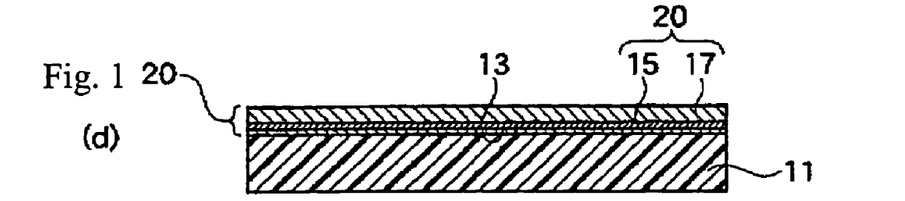
Figure 1E:
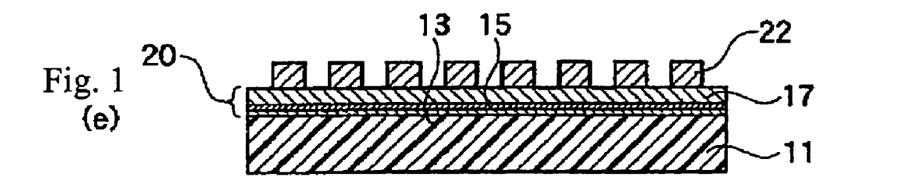
Figure 1F:
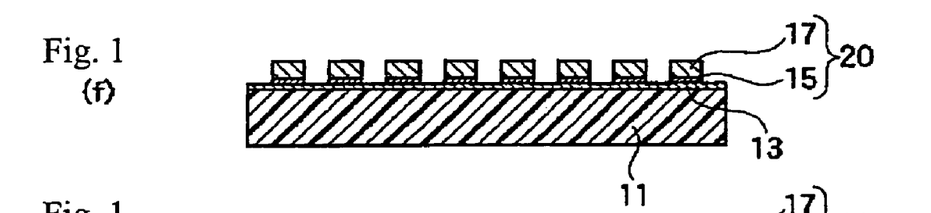
Figures 1G, 1H:
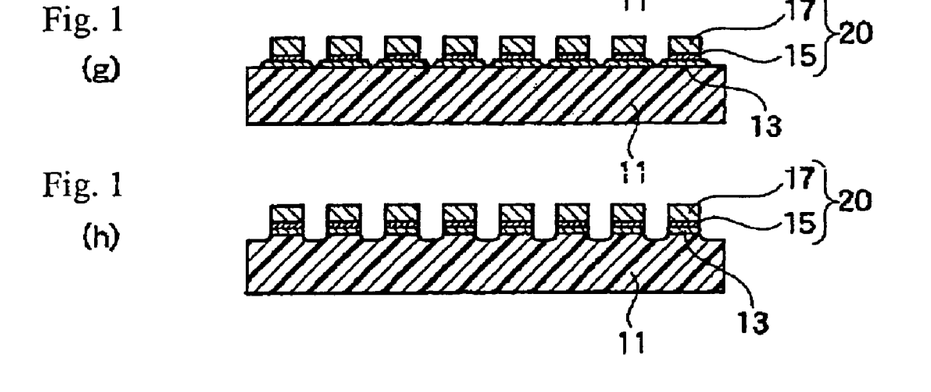
Figure 2:
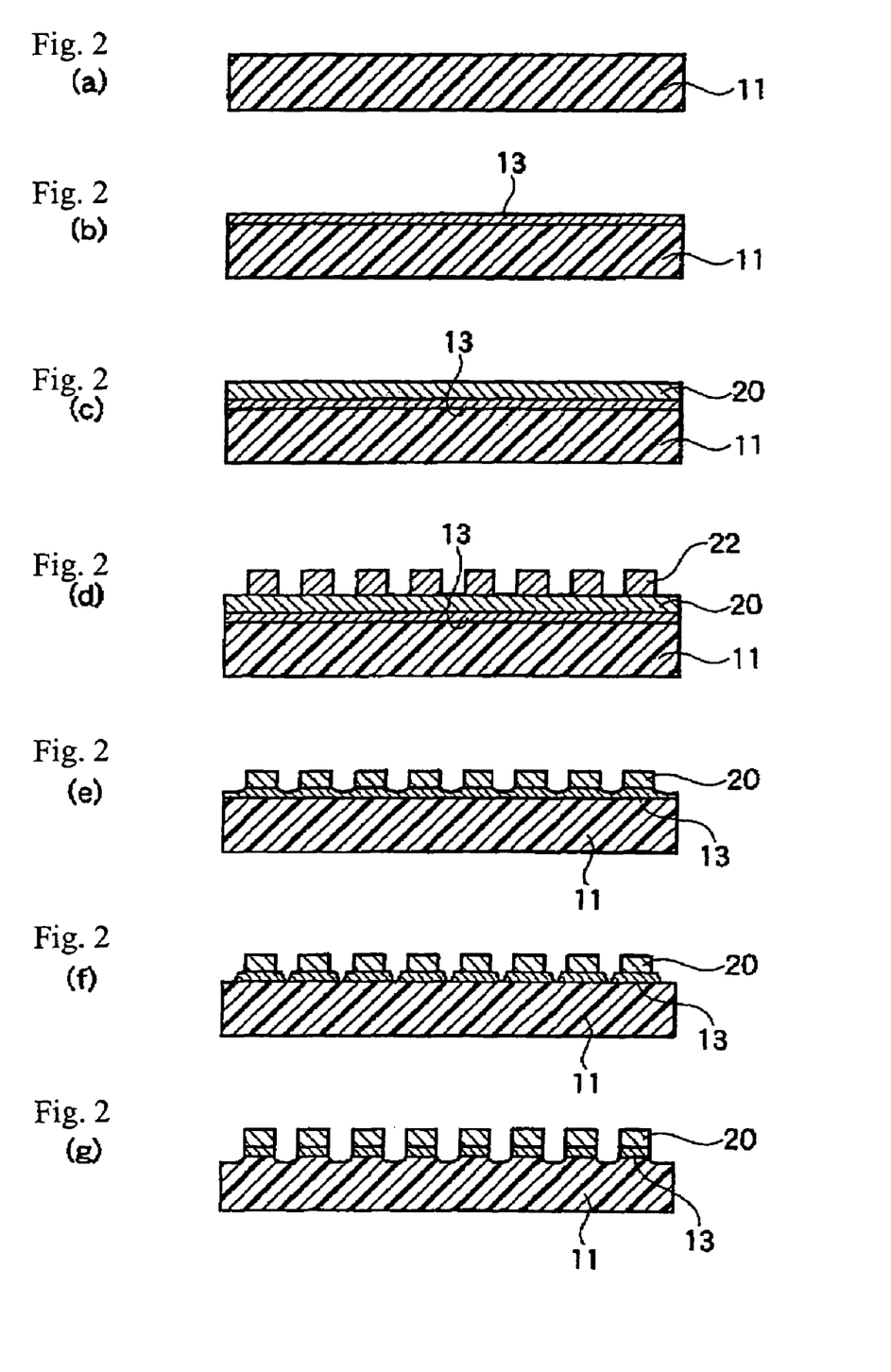
FIGS. 2(a)-2(g) are a set of sectional views of a board also depicting various steps of manufacturing a printed wiring board according to the present invention.

FIGS. 1 and 2 illustrate cross sections of a printed wiring board in steps of manufacturing according to the invention. The members common in the figures below are indicated with the same numerals.

As shown in FIGS. 1 and 2, the printed wiring board manufacturing process employs a substrate film that comprises an insulating film and a metal layer on at least one surface of the insulating film that is composed of a base metal layer 12 and a conductive metal layer 20. In the process, the metal layer is selectively etched to form a wiring pattern. The metal layer may be provided on either or both surfaces of the insulating film.

Referring to FIGS. 1(a) and 2(a), the printed wiring board manufacturing process performs deposition of a base metal on at least one surface of the insulating film 11 to form the base metal layer 13. Examples of the insulating films include polyimide films, polyimidamide films, polyester films, polyphenylene sulfide films, polyetherimide films and liquid crystal polymer films. In particular, the insulating film in the invention is preferably a polyimide film. The insulating film 11, for example a polyimide film, is hardly deformed by heat applied in the deposition of the base metal layer 13, possesses acid and alkali resistance such that it will not be corroded with an etching solution or an alkaline solution used in rinsing, and has heat resistance enough to avoid deformation by heat applied in the deposition of the base metal layer 13.

The insulating film 11 generally has an average thickness of 7 to 80 μm, preferably 7 to 50 μm, and particularly preferably 15 to 40 μm. The invention is suited for manufacturing a thin printed wiring board, and therefore preferably uses an insulating film having a smaller thickness. The surface of the insulating film 11 may be roughened by use of a hydrazine/KOH solution or may be plasma treated to enhance adhesion with the base metal layer 13.

The insulating film 11 is overlaid with the base metal layer 13 as illustrated in FIGS. 1(b) and 2(b). The base metal layer 13 is provided on at least one surface of the insulating film 11, for instance the polyimide film, and it gives enhanced adhesion between the insulating film 11 and the conductive metal layer formed on the base metal layer 13.

The metals for the base metal layer 13 include copper, nickel, chrome, molybdenum, tungsten, silicon, palladium, titanium, vanadium, iron, cobalt, manganese, aluminum, zinc, tin and tantalum. These metals may be used singly or in combination. Of these, the base metal layer 13 is preferably formed from nickel, chrome or an alloy thereof. Preferably, the base metal layer 13 is formed on the polyimide film 11 by a dry metal layer production process such as deposition or sputtering. The thickness of the base metal layer is generally in the range of 1 to 100 nm, and preferably 2 to 50 nm. The provision of the base metal layer 13 has a purpose of stable formation of the conductive metal layer 20 thereon. Therefore, it is preferable that the base metal layer is formed by causing the base metal to collide with the insulating film 11 with a kinetic energy such that part of the base metal physically penetrates into the film surface.

Accordingly, the base metal layer 13 in the invention is particularly preferably a sputtered layer of the above base metal.

After the base metal layer 13 is formed as described above, the conductive metal layer 20 is provided on the base metal layer 13. The conductive metal layer 20 may be produced by a plating technique such as electrolytic plating or electroless plating. The average thickness of the conductive metal layer 20 is generally in the range of 0.5 to 40 μm, preferably 1 to 18 μm, and more preferably 2 to 12 μm.

FIG. 2(d) shows a state in which the conductive metal layer 20 is formed directly on the base metal layer 13 by plating.

The conductive metal layer 20 may be formed directly on the base metal layer 13 as above or may be formed through a layer which is provided on the base metal layer 13 by the same method to that for forming the base metal layer and which comprises the same metal as that of the conductive metal layer 20.

FIG. 1(c) illustrates the above embodiment. That is, the layer directly on the base metal layer 13 comprises the same metal as that of the conductive metal layer and is produced by the same method to that for forming the base metal layer 13. For example, when the base metal layer 13 is made by sputtering nickel and chrome, the layer on the base metal layer 13 is produced by sputtering. The thickness of sputtered copper layer 15 is generally in the range of 10 to 2000 nm, and preferably 20 to 500 nm. The ratio of the average thickness of the base metal layer 13 and the thickness of the sputtered copper layer 15 is generally in the range of 1:20 to 1:100, and preferably 1:25 to 1:60.

After the sputtered copper layer 15 is formed as described above, a further copper layer is provided on the sputtered copper layer 15 as shown in FIG. 1(d). This overlaying copper layer is indicated with the numeral 17 in FIG. 1(d). Although sputtering or deposition may be employed to produce the copper layer 17, a plating technique such as electrolytic plating or electroless plating is preferable. The reason is that, because the copper layer 17 needs to have a certain level of thickness for forming the wiring pattern, a plating technique such as electrolytic plating or electroless plating permits effective copper plating. The plated copper layer 17 generally ranges in average thickness from 0.5 to 40 μm, preferably from 0.5 to 17.5 μm, and more preferably 1.5 to 11.5 μm. The total thickness of the sputtered copper layer 15 and the plated copper layer 17 is generally in the range of 1 to 40 μm, preferably 1 to 18 μm, and more preferably 2 to 12 μm. Once the plated copper layer 17 is formed, the sputtered copper layer 15 and the plated copper layer 17 are extremely difficult to distinguish from each other by cross-sectional structure. Thus, these layers hereinbelow will be collectively referred to as the conductive metal layer 20 unless the need arises to describe them separately.

After the conductive metal layer 20 is produced as described above, a photosensitive resin is applied to a surface of the conductive metal layer 20 and is photoexposed and developed to create a desired pattern 22 of the photosensitive resin, as shown in FIGS. 1(e) and 2(e). The photosensitive resin used herein may be a type that hardens by photoexposure or a type that softens upon photoexposure.

The pattern 22 of the photosensitive resin is used as a mask to selectively etch the conductive metal layer 20, and a desired wiring pattern is produced as illustrated in FIGS. 1(f) and 2(f).

After formation of the wiring pattern, the pattern 22 of the photosensitive resin is removed by alkali cleaning or the like.

The etching agent used herein is capable of etching the metal of the conductive metal layer 20, typically copper. Examples of the conductive metal etching agents include etching solutions based on ferric chloride, etching solutions based on cupric chloride, and sulfuric acid-hydrogen peroxide mixture. The conductive metal etching agent can etch the conductive metal layer 20 with excellent selectivity to create a wiring pattern, and has appreciable etching capability for the base metal layer 13 between the conductive metal layer 20 and the insulating film 11. Therefore, the conductive metal etching agent can etch the conductive metal layer and the base metal layer 13 to a considerable depth as shown in FIGS. 1(f) and 2(f). The base metal layer 13 is etched to an extent such that the layer remaining on the insulating film has an extremely small thickness of about several nm.

In the present invention, the base metal layer 13 is treated with predetermined treatment liquids as described later. Prior to the treatment, microetching is preferably performed to remove an oxide layer or the like from the surface of the conductive metal layer 20 which forms the wiring pattern, and the surface of the base metal indicated with the numeral 13, as shown in FIGS. 1(g) and (g).

The microetching can use a common etching solution, with examples including potassium persulfate ($K_2S_2O_8$) solution, HCl solution and the etching solutions used for forming the wiring pattern. The prolonged contact with the etching solution increases the elution of copper forming the wiring pattern, and the wiring pattern becomes thin. Accordingly, the contact time between the etching solution and the wiring pattern in the microetching is generally in the range of about 2 to 60 seconds, and preferably about 10 to 45 seconds.

After the selective etching of the conductive metal layer 20 and the microetching, the base metal layer 13 is treated with a first treatment liquid capable of dissolving Ni contained in the layer, as illustrated in FIG. 1(h). After the treatment with the Ni-dissolving first treatment liquid, the base metal layer 13 is treated with a second treatment liquid capable of dissolving Cr contained in the layer and also capable of dissolving the insulating film, so that the superficial surface of the insulating film exposed from the wiring pattern is treated.

The Ni-dissolving first treatment liquids include mixtures of approximately 5 to 15% by weight each of sulfuric acid and hydrochloric acid.

The treatment using the Ni-dissolving first treatment liquid eliminates part of the metals contained in the base metal layer 13. This treatment is generally performed at temperatures of 30 to 55° C., preferably 35 to 45° C., and over a period of 2 to 40 seconds, preferably 2 to 30 seconds.

After the treatment using the Ni-dissolving first treatment liquid, the layer is treated with the second treatment liquid capable of dissolving Cr and the insulating film. That is, the second treatment liquid capable of dissolving Cr and the insulating film removes the base metal 13 remaining in the base metal layer 13 and chemically polishes the surface of the insulating film.

As a result, the second treatment liquid eliminates the base metal layer 13 and cuts (dissolves away) the insulating film 11 to a depth of 1 to 100 nm, and preferably 5 to 50 nm from the surface 27 of the insulating film 11, as shown in FIGS. 1(h), 2(h), 3 and 4.

The second treatment liquids include aqueous potassium permanganate/KOH solution, aqueous potassium dichromate solution and aqueous sodium permanganate/NaOH solution. When the invention employs an aqueous potassium permanganate/KOH solution as the second treatment liquid, the potassium permanganate concentration is generally in the range of 10 to 60 g/l, and preferably 25 to 55 g/l; the KOH concentration is preferably in the range of 10 to 30 g/l. In the invention, the treatment using the above second treatment liquid is performed at temperatures of 40 to 70° C., preferably 50 to 65° C., and over a period of 10 to 60 seconds, preferably 15 to 45 seconds. The treatment under the above conditions eliminates the insulating film 11 to a depth 21 from the surface 27 exposed from the wiring pattern. Specifically, the printed wiring board of the invention has a configuration such that the insulating film in an area exposed from the wiring pattern has a thickness smaller by 1 to 100 nm, and preferably 2 to 50 nm than that of an area under the wiring pattern. The base metal layer 13 and the insulating film 11 under the wiring pattern are protected by the conductive metal layer 20.

In the printed wiring board, the wiring pattern has a configuration in which the cross-sectional width of a lower end 28 of the wiring pattern (conductive metal layer 20) is the same or substantially the same as the cross-sectional width of an upper end 26 of the base metal layer 13.

Figure 3:
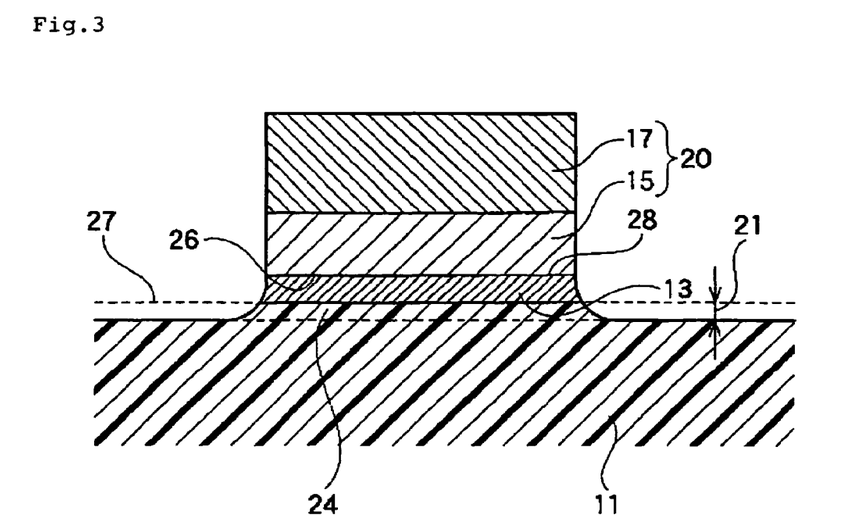
FIG. 3 is a sectional view of a wiring pattern produced by selective etching of a copper layer and treating with first and second treatment liquids.
Figure 4:
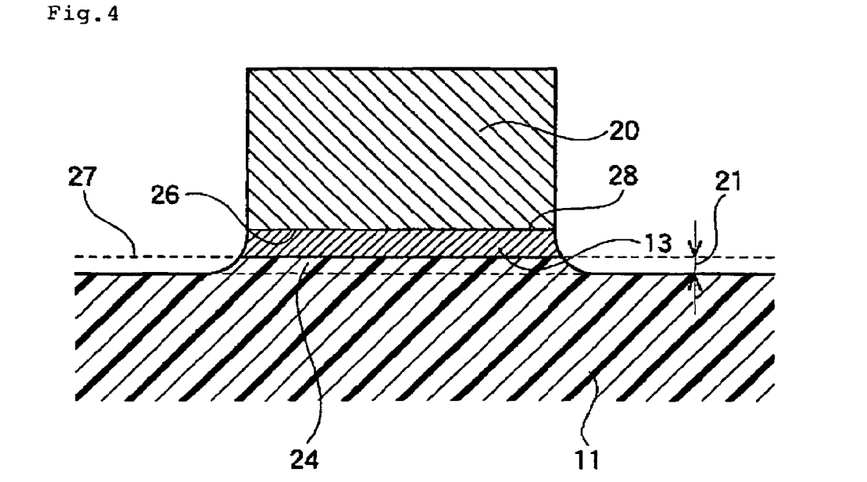
FIG. 4 is a sectional view of a wiring pattern produced by selective etching of a copper layer and treating with first and second treatment liquids.
Figure 5:
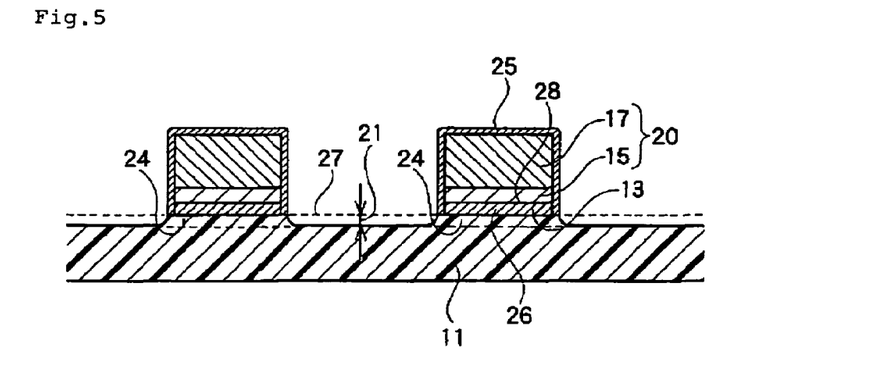
FIG. 5 is a sectional view of a plated wiring pattern produced by a process of the present invention.
Figure 6:
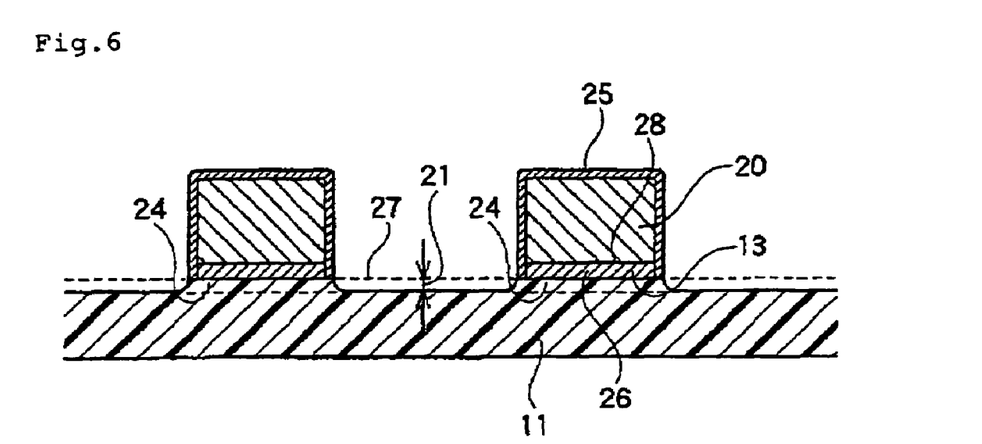
FIG. 6 is a sectional view of a plated wiring pattern produced by a process of the present invention.

The printed wiring board according to the present invention comprises the insulating film and the wiring pattern formed on at least one surface of the insulating film, wherein the insulating film, which is a polyimide film, in an area under the wiring pattern is thicker by 1 to 100 nm, and preferably 2 to 50 nm than without the wiring pattern. That is, as shown in FIGS. 3 and 4, the surface of the insulating (polyimide) film without the wiring pattern is cut to a depth of 1 to 100 nm, and preferably 2 to 50 nm. Consequently, the area under the wiring pattern forms a substrate base 24 trapezoidal in cross section having a height of 1 to 100 nm, and preferably 2 to 50 nm.

In the above exemplary preferred embodiment that performs the microetching and treatments with the first and second treatment liquids, the surface of the insulating film exposed from the wiring pattern is removed. Even when the metal of the base metal layer 13 is present in the surface by chemically combining with a component of the insulating film, the metal is removed together with the surface of the insulating film. Therefore, the surface of the insulating film without the wiring pattern does not contain any residual metal. Accordingly, the insulating film surface without the wiring pattern can attain its inherent high insulating properties.

In the treatment with the second treatment liquid, the side end surface of the base metal layer 13 (wiring pattern) is generally brought to a passive state by contact with the second treatment liquid.

After the treatment of the second treatment liquid, a solder resist layer is provided so as to expose inner leads for connection with an electronic component to be mounted, and outer leads for connection with an outside device. The surface of the inner and outer leads exposed from the solder resist layer is coated with a plating 25 as shown in FIG. 3. Examples of suitable platings include tin plating, gold plating, nickel-gold plating, solder plating and lead-free solder plating. The plating treatment may be performed in a manner in which the wiring pattern is coated with a thin plating before application of the solder resist, the solder resist layer is then formed on the thin plating, and the terminals exposed from the solder resist layer are plated. The plating thickness may be determined appropriately depending on the plating materials. For example, electroless Sn plating may de designed such that the total thickness of the plating will be 0.2 to 0.8 μm, and preferably 0.3 to 0.6 μm.

After the plating treatment, the inner leads are electrically connected with an electronic component and the electronic component is sealed with a resin to manufacture a circuit device according to the present invention.

The printed wiring board and the circuit device of the invention have a remarkably reduced possibility of variation of electrical resistance between wires by migration of metals because the surface of the insulating film exposed from the wiring pattern does not contain any metals. That is, the printed wiring board and the circuit device are unlikely to suffer migration and do not substantially change the insulation resistance after long-term continuous application of voltage. Therefore, the printed wiring board achieves very high reliability.

The printed wiring board of the invention is suitable as a printed wiring board that has wiring patterns in which the width of wires (leads) is 30 μm or less, and preferably in the range of 25 to 5 μm, and the pitch is 50 μm or less, and preferably in the range of 40 to 10 μm. Such printed wiring boards include printed wiring boards (PWB), TAB (tape automated bonding) tapes, COF (chip on film) tapes, CSP (chip size package) tapes, BGA (ball grid array) tapes, μ-BGA (μ-ball grid array) tapes and FPC (flexible printed circuit). Although the printed wiring board described above includes the insulating film and wiring patterns formed thereon, it may further contain an electronic component mounted on part of the wiring patterns.

EXAMPLES

The printed wiring board and manufacturing process will be described in detail with reference to the following examples, but it should be construed that the invention is in no way limited to the examples.

The insulation resistances in Examples and Comparative Examples are values measured at room temperature outside a thermohygrostat.

Example 1

A polyimide film (UPILEX S, manufactured by UBE INDUSTRIES, LTD.) having an average thickness of 50 μm was roughened on one surface by reverse sputtering. Subsequently, a nickel-chrome alloy layer was sputtered in an average thickness of 40 nm under the following conditions to prepare a base metal layer.

The sputtering conditions were such that the 50 μm-thick polyimide film was treated at 100° C. and $3 \times 10^{-5}$ Pa for 10 minutes, followed by degasification, and a chrome-nickel alloy was sputtered at 100° C. and 0.5 Pa.

On the base metal layer, copper was sputtered at 100° C. and 0.5 Pa in an average thickness of 300 nm.

The sputtered copper layer was electroplated with copper, and an electrolytic copper layer (electroplated copper layer) having a thickness of 8 μm was formed.

The copper layer (conductive metal layer) was coated with a photosensitive resin, and the resin was photoexposed and developed to produce comb-shaped wiring patterns having wire pitches of 30 μm (wire width: 15 μm, space width: 15 μm). The patterns were used as masks, and the copper layer was etched with a 12% cupric chloride etching solution containing 100 g/l of HCl for 30 seconds. Thus, wiring patterns were produced.

The photosensitive resin masks on the wiring patterns were removed by treatment with a $NaOH/Na_2CO_3$ solution at 40° C. for 30 seconds. Thereafter, the conductive metal layer and the base metal layer (Ni—Cr alloy) were acid cleaned with a $K_2S_2O_8/H_2SO_4$ microetching solution at 30° C. for 10 seconds.

Subsequently, the base metal layer made of Ni—Cr alloy was treated with a first treatment liquid capable of dissolving Ni, which was a 15% HCl plus 15% $H_2SO_4$ solution, at 50° C. for 30 seconds to dissolve Ni. Further, a second treatment liquid capable of dissolving Cr and polyimide, which was a solution of 40 g/l of potassium permanganate and 20 g/l of KOH, was used to dissolve away the metal between wires together with the underlying polyimide film to a depth of 50 nm, followed by rinsing with water.

Thereafter, a solder resist layer was formed so as to expose inner and outer leads. The exposed inner and outer leads were coated with 0.5 μm of Sn plating, followed by heating to form a pure Sn layer with a predetermined thickness.

The printed wiring board having the comb-shaped wiring was subjected to a 1000-hour continuity test (HHBT) at a voltage of 40 V under the conditions of 85° C. and 85% RH. This continuity test is an accelerated test, and the time to short circuit, for example the time to an insulation resistance below $1\times10^8$ Ω, being less than 1000 hours indicates that the printed wiring board is unusable as common board. The printed wiring board manufactured herein had an insulation resistance of $7\times10^{14}$ Ω before the insulation reliability test, which was higher than those in Comparative Examples. The insulation resistance after the insulation reliability test was $8\times10^{14}$ Ω. There was no substantial difference of insulation resistance between before and after application of voltage.

The results are shown in Table 1.

Example 2

A polyimide film (UPILEX S, manufactured by UBE INDUSTRIES, LTD.) having an average thickness of 50 μm was roughened on one surface by reverse sputtering. Subsequently, a nickel-chrome alloy layer was sputtered in an average thickness of 40 nm under the following conditions to prepare a base metal layer.

The sputtering conditions were such that the 50 μm-thick polyimide film was treated at 100° C. and $3\times10^{-5}$ Pa for 10 minutes, followed by degasification, and a chrome-nickel alloy was sputtered at 100° C. and 0.5 Pa.

The base metal layer sputtered as described above was electroplated with copper, and a conductive metal layer (electroplated copper layer) having a thickness of 8 μm was formed.

The conductive metal layer was coated with a photosensitive resin, and the resin was photoexposed and developed to produce comb-shaped wiring patterns having wire pitches of 30 μm (wire width: 15 μm, space width: 15 μm). The patterns were used as masks, and the copper layer was etched with a 12% cupric chloride etching solution containing 100 g/l of HCl for 30 seconds. Thus, wiring patterns were produced.

The photosensitive resin masks on the wiring patterns were removed by treatment with a $NaOH/Na_2CO_3$ solution at 40° C. for 30 seconds. Thereafter, the conductive metal layer and the base metal layer (Ni—Cr alloy) were acid cleaned with a $K_2S_2O_8/H_2SO_4$ microetching solution at 30° C. for 10 seconds.

Subsequently, the base metal layer made of Ni—Cr alloy was treated with a first treatment liquid capable of dissolving Ni, which was a 15% HCl plus 15% $H_2SO_4$ solution, at 50° C. for 30 seconds to dissolve Ni. Further, a second treatment liquid capable of dissolving Cr and polyimide, which was a solution of 40 g/l of potassium permanganate and 20 g/l of KOH, was used to dissolve away the metal between wires together with the underlying polyimide film to a depth of 50 nm.

Thereafter, a solder resist layer was formed so as to expose inner and outer leads. The exposed inner and outer leads were coated with 0.5 μm of Sn plating, followed by heating to form a pure Sn layer with a predetermined thickness. The printed wiring board having the comb-shaped wiring was subjected to a 1000-hour continuity test (HHBT) at a voltage of 40 V under the conditions of 85° C. and 85% RH. The insulation resistance before the insulation reliability test was $7\times10^{14}$ Ω, which was higher than those in Comparative Examples. There was no substantial difference of insulation resistance between before and after application of voltage.

The results are shown in Table 1.

Example 3

A polyimide film (UPILEX S, manufactured by UBE INDUSTRIES, LTD.) having an average thickness of 75 μm was roughened on one surface by reverse sputtering. Subsequently, a nickel-chrome alloy layer was sputtered in an average thickness of 30 nm under the same conditions as in Example 1 to prepare a base metal layer.

On the base metal layer, copper was sputtered in an average thickness of 200 nm under the conditions as described in Example 1.

The sputtered copper layer was electroplated with copper, and a conductive metal layer of electrolytic copper having a thickness of 8 μm was formed.

The conductive metal layer was coated with a photosensitive resin, and the resin was photoexposed and developed to produce comb-shaped wiring patterns having wire pitches of 30 μm. The patterns were used as masks, and the conductive metal layer was etched with a 12% cupric chloride etching solution containing 100 g/l of HCl for 30 seconds. Thus, wiring patterns were produced.

The photosensitive resin masks on the wiring patterns were removed by treatment with a $NaOH/Na_2CO_3$ solution at 40° C. for 30 seconds. Thereafter, the conductive metal layer and the base metal layer (Ni—Cr alloy) were acid cleaned with a HCl microetching solution at 30° C. for 10 seconds.

Subsequently, the base metal layer made of Ni—Cr alloy was treated with a first treatment liquid capable of dissolving Ni, which was a 12% HCl plus 12% $H_2SO_4$ solution, at 55° C. for 20 seconds to dissolve Ni.

Further, a treatment was performed using a second treatment liquid capable of dissolving Cr and polyimide, which was a solution of 40 g/l of $KMnO_4$ and 20 g/l of KOH, at 65° C. for 30 seconds to dissolve away the polyimide film between wires to a depth of 30 nm.

Thereafter, a solder resist layer was formed so as to expose inner and outer leads. The exposed inner and outer leads were coated with 0.5 μm of Sn plating, followed by heating to form a pure Sn layer with a predetermined thickness.

The printed wiring board having the comb-shaped wiring was subjected to a 1000-hour continuity test (HHBT) at a voltage of 40 V under the conditions of 85° C. and 85% RH. The insulation resistance before the insulation reliability test was $8\times10^{14}$ Ω, which was higher than those in Comparative Examples. The insulation resistance after the insulation reliability test was $1\times10^{14}$ Ω. There was no substantial difference of insulation resistance between before and after application of voltage.

The results are shown in Table 1.

Example 4

A polyimide film (UPILEX S, manufactured by UBE INDUSTRIES, LTD.) having an average thickness of 75 μm was roughened on one surface by reverse sputtering. Subsequently, a nickel-chrome alloy layer was sputtered in an average thickness of 30 nm under the same conditions as in Example 2 to prepare a base metal layer.

The base metal layer was electroplated with copper, and a conductive metal layer having a thickness of 8 μm was formed.

The conductive metal layer was coated with a photosensitive resin, and the resin was photoexposed and developed to produce comb-shaped wiring patterns having wire pitches of 30 μm. The patterns were used as masks, and the conductive metal layer was etched with a 12% cupric chloride etching solution containing 100 g/l of HCl for 30 seconds. Thus, wiring patterns were produced in a configuration similar to that of the photosensitive resin patterns.

The photosensitive resin masks on the wiring patterns were removed by treatment with a $NaOH/Na_2CO_3$ solution at 40° C. for 30 seconds. Thereafter, the conductive metal layer and the base metal layer (Ni—Cr alloy) were acid cleaned with a HCl microetching solution at 30° C. for 10 seconds.

Subsequently, the base metal layer made of Ni—Cr alloy was treated with a first treatment liquid capable of dissolving Ni, which was a 12% HCl plus 12% $H_2SO_4$ solution, at 55° C. for 20 seconds to dissolve Ni.

Further, a treatment was performed using a second treatment liquid capable of dissolving Cr and polyimide, which was a solution of 40 g/l of $KMnO_4$ and 20 g/l of KOH, at 65° C. for 30 seconds to remove the polyimide film between wires to a depth of 30 nm.

Thereafter, a solder resist layer was formed so as to expose inner and outer leads. The exposed inner and outer leads were coated with 0.5 μm of Sn plating, followed by heating to form a pure Sn layer with a predetermined thickness.

The printed wiring board having the comb-shaped wiring was subjected to a 1000-hour continuity test (HHBT) at a voltage of 40 V under the conditions of 85° C. and 85% RH. The insulation resistance before the insulation reliability test was $8 \times 10^{14}$ Ω, which was higher than those in Comparative Examples. The insulation resistance after the insulation reliability test was $3 \times 10^{14}$ Ω. There was no substantial difference of insulation resistance between before and after application of voltage.

The results are shown in Table 1.

Example 5

A printed wiring board was manufactured in the same manner as in Example 1, except that microetching was not performed.

The printed wiring board having the comb-shaped wiring was subjected to a 1000-hour continuity test (HHBT) at a voltage of 40 V under the conditions of 85° C. and 85% RH. The insulation resistance before the insulation reliability test was $4 \times 10^{14}$ Ω, which was higher than those in Comparative Examples. The insulation resistance after the insulation reliability test was $7 \times 10^{13}$ Ω. There was no substantial difference of insulation resistance between before and after application of voltage.

The results are shown in Table 1.

Example 6

A printed wiring board was manufactured in the same manner as in Example 2, except that microetching was not performed.

The printed wiring board having the comb-shaped wiring was subjected to a 1000-hour continuity test (HHBT) at a voltage of 40 V under the conditions of 85° C. and 85% RH. The insulation resistance before the insulation reliability test was $4 \times 10^{14}$ Ω, which was higher than those in Comparative Examples. The insulation resistance after the insulation reliability test was $7 \times 10^{13}$ Ω. There was no substantial difference of insulation resistance between before and after application of voltage.

The results are shown in Table 1.

Comparative Example 1

A polyimide film (Kapton 100EN, manufactured by DU PONT-TORAY CO., LTD.) having a thickness of 25 μm was roughened on one surface by treatment with an aqueous 30%-hydrazine/KOH solution for 60 seconds, followed by rinsing with pure water for 10 minutes and drying at room temperature. The polyimide film was placed in a vacuum deposition apparatus and was plasma treated. Thereafter, a Ni—Cr alloy layer was sputtered in a thickness of 40 nm and a copper layer was plated in a thickness of 8 μm. Thus, a metal-coated polyimide substrate was prepared.

The substrate was etched with a 40 degree Baumé ferric chloride solution to produce comb-shaped wiring patterns at pitches of 40 μm (wire width: 20 μm, space width: 20 μm). The patterns were rinsed with a 35° C. aqueous solution of 0.5% by weight each of potassium permanganate and sodium hydroxide, followed by rinsing with water and drying. The sample was then placed in a thermohygrostat in which the atmosphere was maintained at 85° C. and 85% RH. An insulation reliability test (HHBT) was performed by biasing the sample at 60 V. The retention time was over 1000 hours. The insulation resistance at the initiation of the insulation reliability test was $5 \times 10^{12}$ Ω, but it lowered to $2 \times 10^{10}$ Ω after 1000 hours. That is, the insulation resistance lowered with time by application of voltage over a long period of time.

Comparative Example 2

A polyimide film (UPILEX S, manufactured by UBE INDUSTRIES, LTD.) having an average thickness of 50 μm was roughened on one surface by reverse sputtering. Subsequently, a nickel-chrome alloy layer was sputtered in an average thickness of 30 nm under the same conditions as in Example 1 to prepare a base metal layer.

On the base metal layer, copper was sputtered in an average thickness of 300 nm.

The base metal layer formed as described above was electroplated with copper, and an electrolytic copper layer having a thickness of 8 μm was formed.

The copper layer was coated with a photosensitive resin, and the resin was photoexposed and developed to produce comb-shaped wiring patterns having wire pitches of 30 μm. The patterns were used as masks, and the copper layer was etched with a 12% cupric chloride etching solution containing 100 g/l of HCl for 30 seconds. Thus, wiring patterns were produced.

The copper patterns and protruded Ni—Cr base metal layer were acid cleaned with a $K_2S_2O_8/H_2SO_4$ microetching solution at 30° C. for 10 seconds.

Thereafter, a solder resist layer was formed so as to expose inner and outer leads. The exposed inner and outer leads were coated with 0.5 μm of Sn plating, followed by heating to form a pure Sn layer with a predetermined thickness.

The printed wiring board having the comb-shaped wiring was subjected to a continuity test at a voltage of 40 V under the conditions of 85° C. and 85% RH. The insulation resistance before the insulation reliability test was $1 \times 10^8$ Ω, and it lowered to $3 \times 10^5$ after 10 hours.

The results are shown in Table 1.

TABLE 1

| | Base metal layer | | Sputtered layer | | Plating | |
|---|---|---|---|---|---|---|
| | Polyimide | Nickel-chrome | Metal | Thickness | Metal | Thickness |
| Ex. 1 | 50 μm | 40 nm | Copper | 300 nm | Electrolytic copper | 8 μm |
| Ex. 2 | 50 μm | 40 nm | — | — | Electrolytic copper | 8 μm |
| Ex. 3 | 75 μm | 30 nm | Copper | 200 nm | Electrolytic copper | 8 μm |
| Ex. 4 | 75 μm | 30 nm | — | — | Electrolytic copper | 8 μm |
| Ex. 5 | 50 μm | 40 nm | Copper | 300 nm | Electrolytic copper | 8 μm |
| Ex. 6 | 50 μm | 40 nm | — | — | Electrolytic copper | 8 μm |
| Comp. Ex. 1 | 25 μm | 40 nm | Copper | 300 nm | Electrolytic copper | 8 μm |
| Comp. Ex. 2 | 50 μm | 30 nm | Copper | 300 nm | Electrolytic copper | 8 μm |

| | Etching agent | | | | HHBT |
|---|---|---|---|---|---|
| | Cu etching | Microetching | First treatment liquid | Second treatment liquid | Insulation resistance after 1000 hours |
| Ex. 1 | Cupric chloride | $K_2S_2O_8 + H_2SO_4$ | 15% HCl + 15% $H_2SO_4$ | $KMnO_4$ + KOH | $8 \times 10^{14}$ Ω |
| Ex. 2 | Cupric chloride | $K_2S_2O_8 + H_2SO_4$ | 15% HCl + 15% $H_2SO_4$ | $KMnO_4$ + KOH | $7 \times 10^{14}$ Ω |
| Ex. 3 | Cupric chloride | HCl | 12% HCl + 12% $H_2SO_4$ | $KMnO_4$ + KOH | $1 \times 10^{14}$ Ω |
| Ex. 4 | Cupric chloride | HCl | 12% HCl + 12% $H_2SO_4$ | $KMnO_4$ + KOH | $3 \times 10^{14}$ Ω |
| EX. 5 | Cupric chloride | None | 15% HCl + 15% $H_2SO_4$ | $KMnO_4$ + KOH | $7 \times 10^{13}$ Ω |
| Ex. 6 | Cupric chloride | None | 15% HCl + 15% $H_2SO_4$ | $KMnO_4$ + KOH | $7 \times 10^{13}$ Ω |
| Comp. Ex. 1 | Ferric chloride | None | $KMnO_4$ + KOH | | $2 \times 10^{10}$ Ω |
| Comp. Ex. 2 | Cupric chloride | $K_2S_2O_8 + H_2SO_4$ | None | | $3 \times 10^5$ Ω (after 10 hr) |

The printed wiring board manufacturing process, printed wiring board obtained by the process, and circuit device of the invention achieve long-term stable insulation between wires because the metals present in the polyimide film surface between wires are removed together with the superficial surface of the insulating film, namely, the insulating film between wires does not contain any metal. Accordingly, metal deposition or migration originating from the residual metals is prevented.

The insulation resistance between wires is not changed by long-term biasing, and therefore the printed wiring board exhibits very high electrical stability over time.

The invention claimed is:

1. A process for manufacturing a printed wiring board, which process comprises preparing a laminated film comprising a polyimide film and a copper layer provided on at least one surface of the polyimide film with a sputtered metal layer formed from nickel, chrome or an alloy thereof in between, selectively etching the copper layer and the sputtered metal layer of the laminated film to produce a wiring pattern, treating the laminated film with a first treatment liquid capable of dissolving nickel of the sputtered metal layer, and treating with a second treatment liquid capable of dissolving chrome of the sputtered metal layer and also capable of eliminating the sputtered metal layer in the polyimide film to remove a superficial surface of the polyimide film exposed from the wiring pattern together with the residual sputtered metals in the superficial surface, wherein the laminated film is treated with the first treatment liquid including mixtures of approximately 5 to 15 % by weight each of sulfuric acid and hydrochloric acid at temperatures of 30 to 55° C. over a period of 2 to 40 seconds and further treated with the second treatment liquid including aqueous potassium permanganate/KOH solution having the potassium permanganate concentration of 10 to 60 g/l at temperatures of 40 to 70° C. over a period of 10 to 60 seconds.

* * * * *